United States Patent
Nunokawa et al.

(10) Patent No.: US 6,520,605 B2
(45) Date of Patent: Feb. 18, 2003

(54) WALL MOUNTING DEVICE FOR ELECTRONIC EQUIPMENT CASE

(75) Inventors: Masaru Nunokawa, Machida (JP); Kimitoshi Fujii, Yokohama (JP)

(73) Assignee: Matsushita Electric Industrial Co. Ltd., Osaka (JP)

(*) Notice: Subject to any disclaimer, the term of this patent is extended or adjusted under 35 U.S.C. 154(b) by 0 days.

(21) Appl. No.: 09/864,592

(22) Filed: May 24, 2001

(65) Prior Publication Data

US 2002/0084729 A1 Jul. 4, 2002

(30) Foreign Application Priority Data

May 26, 2000 (JP) ........................................ 2000-157418

(51) Int. Cl.[7] ................................................. H05K 5/00
(52) U.S. Cl. ................. 312/111; 312/223.1; 312/223.6; 312/245; 361/735
(58) Field of Search .................. 211/26.2, 26; 312/107, 312/108, 111, 223.1, 223.2, 245; 361/735; 174/50; 248/906

(56) References Cited

U.S. PATENT DOCUMENTS

| | | | | |
|---|---|---|---|---|
| 3,603,845 A | * | 9/1971 | Beers | ........................ 312/107 |
| 3,827,775 A | * | 8/1974 | Arrogante | .................. 126/85 R |
| 5,493,194 A | * | 2/1996 | Damiano et al. | .............. 307/71 |
| 5,747,734 A | * | 5/1998 | Kozlowski et al. | ............ 174/37 |
| 5,796,585 A | * | 8/1998 | Sugiyama et al. | .......... 108/108 |
| 6,172,875 B1 | * | 1/2001 | Suzuki et al. | ................ 361/686 |
| 6,322,399 B1 | * | 11/2001 | Hanning | ..................... 439/406 |

FOREIGN PATENT DOCUMENTS

JP           2943735           6/1999

* cited by examiner

Primary Examiner—Janet M. Wilkens
(74) Attorney, Agent, or Firm—Pearne & Gordon LLP

(57) ABSTRACT

A equipment mounting metal plate to be attached to a wall comprises a receiving shelf for placing a lower face of an electronic equipment case, a mounting base plate from which the receiving shelf is projected, and a fixing part for fixing the electronic equipment case to the receiving shelf. The equipment mounting metal plate is provided with an upper and a lower fitting pieces for fitting equipment extension metal pieces which install a second electronic equipment case in front of the wall overlaid on the first electronic equipment case. Additional installation of the electronic equipment case is conducted by attaching the equipment extension metal pieces to the upper and lower fitting pieces and attaching a second equipment mounting metal plate having the same structure to the equipment extension metal pieces. Thus, a plurality of the electronic equipment cases can be overlaid and installed in front of the wall.

10 Claims, 20 Drawing Sheets

WALL MOUNTING DEVICE FOR ELECTRONIC EQUIPMENT CASE

BACKGROUND OF THE INVENTION

The present invention relates to a wall mounting device for electronic equipment cases in telephone switching equipment or the like, and more particularly to the wall mounting device for the electronic equipment cases each of which is so designed as to contain a PBX (Private Branch Exchange) and a router in an IPTS (IP Telephony System) in one case.

In a conventional wall mounting device of this type, the PBX and the router have been contained in separate cases. The cases for the PBXes have been placed on a table or a floor, or hanged on a wall of a building or the like one by one in a flat arrangement. The cases for the routers have been placed on a table or vertically stacked one above another by employing a rack.

However, in the conventional device as described above, because the cases for the PBXes and the cases for the routers have been constructed separately, and besides, the cases have been placed on the floor or so, mounted on the wall in the flat arrangement, placed on the table, or vertically stacked by means of the rack, a large installation area has been required. Therefore, it has been a problem how effectively they should be arranged in a small space.

SUMMARY OF THE INVENTION

In view of the above described problem, and considering that it has been realized to contain the PBX and the router in the IPTS in a single electronic equipment case, an object of the invention is to provide a wall mounting device for electronic equipment cases in telephone switching equipment or the like which is intended to install the electronic equipment cases each containing a PBX and a router in a single case in this manner effectively on a wall of a building or the like.

In order to attain the above described object, the present invention provides a wall mounting device for electronic equipment cases in telephone switching equipment or the like which is intended to install a plurality of the electronic equipment cases such as the telephone switching equipment on a wall of a building or the like, comprising at least one equipment mounting metal plate to be attached to the wall, wherein the equipment mounting metal plate is composed of a receiving shelf on which a lower face of a first one of the plurality of electronic equipment cases is adapted to be placed, a mounting base plate from which the receiving shelf is projected, and a fixing part for fixing the first electronic equipment case to the mounting base plate, the equipment mounting metal plate being provided with fitting means for fitting a equipment extension metal piece which installs a second electronic equipment case in front of the wall overlaid on the first electronic equipment case.

The invention is also characterized in that the equipment extension metal piece is provided with fitting means for additionally fitting the equipment mounting metal plate to the second electronic equipment case in front of the wall.

Further, the equipment mounting metal plates and the equipment extension metal pieces are alternately arranged on a front face of the wall, whereby the plurality of electronic equipment cases are sequentially overlaid to be installed on the front face of the wall.

According to the present invention constructed in this manner, a plurality of the electronic equipment cases can be sequentially overlaid on the front face of the wall, by adding the equipment mounting metal plates and the equipment extension metal pieces one by one in front of the wall. As the results, the wall having a limited space can be effectively utilized, and a number of the electronic equipment cases can be effectively installed utilizing a room space expanding in front of the wall.

Also, the equipment extension metal piece is fitted to either one of an upper part and a lower part of the equipment mounting metal plate.

According to the present invention constructed in this manner, protrusion of the equipment mounting metal plate from an outer shape of the electronic equipment case can be minimized, thus attaining effective utilization of the wall face, and contributing to an improved appearance.

Further, the equipment extension metal pieces are fitted to both an upper part and a lower part of the equipment mounting metal plate.

The present invention constructed in this manner, can fully deal with an increase in weight due to the fact that the PBX and the router are contained in the single electronic equipment case.

Also, the fixing part for fixing the electronic equipment case formed in the equipment mounting metal plate is composed of an engaging portion which is formed on the mounting base plate and adapted to be engaged with an engaging projection provided on a back face of the electronic equipment case, and a threaded part for screw fitting the electronic equipment case.

According to the present invention constructed in this manner, by engaging the engaging projection on the electronic equipment case with the engaging portion formed on the mounting base plate, the electronic equipment case will be prevented from falling forward, and can be positioned with respect to the equipment mounting metal plate, thus facilitating screwing work which will be conducted thereafter.

Further, the engaging projection and the engaging portion are constructed so that the electronic equipment case can be engaged with the equipment mounting metal plate by laterally moving the case with respect to the metal plate.

According to the present invention constructed in this manner, even though a plurality of the electronic equipment cases have been overlaid and mounted on the wall, the electronic equipment case existing at an intermediate position can be detached by simply moving it in a lateral direction, without removing the other electronic equipment cases as well as the mounting metal plates and the extension metal pieces for installing them.

Also a wire bundle of an electronic equipment such as telephone switching equipment is provided on a left side wall or a right side wall of the electronic equipment case, and a wire cover for covering the wire bundle is attached to the equipment mounting metal plate.

According to the present invention constructed in this manner, by overlaying a plurality of the electronic equipment cases, the wire bundles of the electronic equipment cases can be easily connected to other equipment without any influence from the other electronic equipment cases.

Further, the wire cover is provided with a dented display window for exposing a display part which is provided on a corner of the left side wall or the right side wall of the electronic equipment case.

According to the present invention constructed in this manner, the display part of the electronic equipment case will not be hidden behind the wire cover, but can be easily observed.

Moreover, the fitting means for fitting the equipment mounting metal plate to the equipment extension metal piece for the electronic equipment case are constructed in such a manner that both the metal plate and the metal piece are fitted to each other at their side parts.

According to the present invention constructed in this manner, in case where the wire cover is provided, the fitting means can be exposed only by removing the wire cover, thus facilitating detaching work of the electronic equipment case.

DETAILED DESCRIPTION OF THE PREFERRED EMBODIMENT

Figure 1:
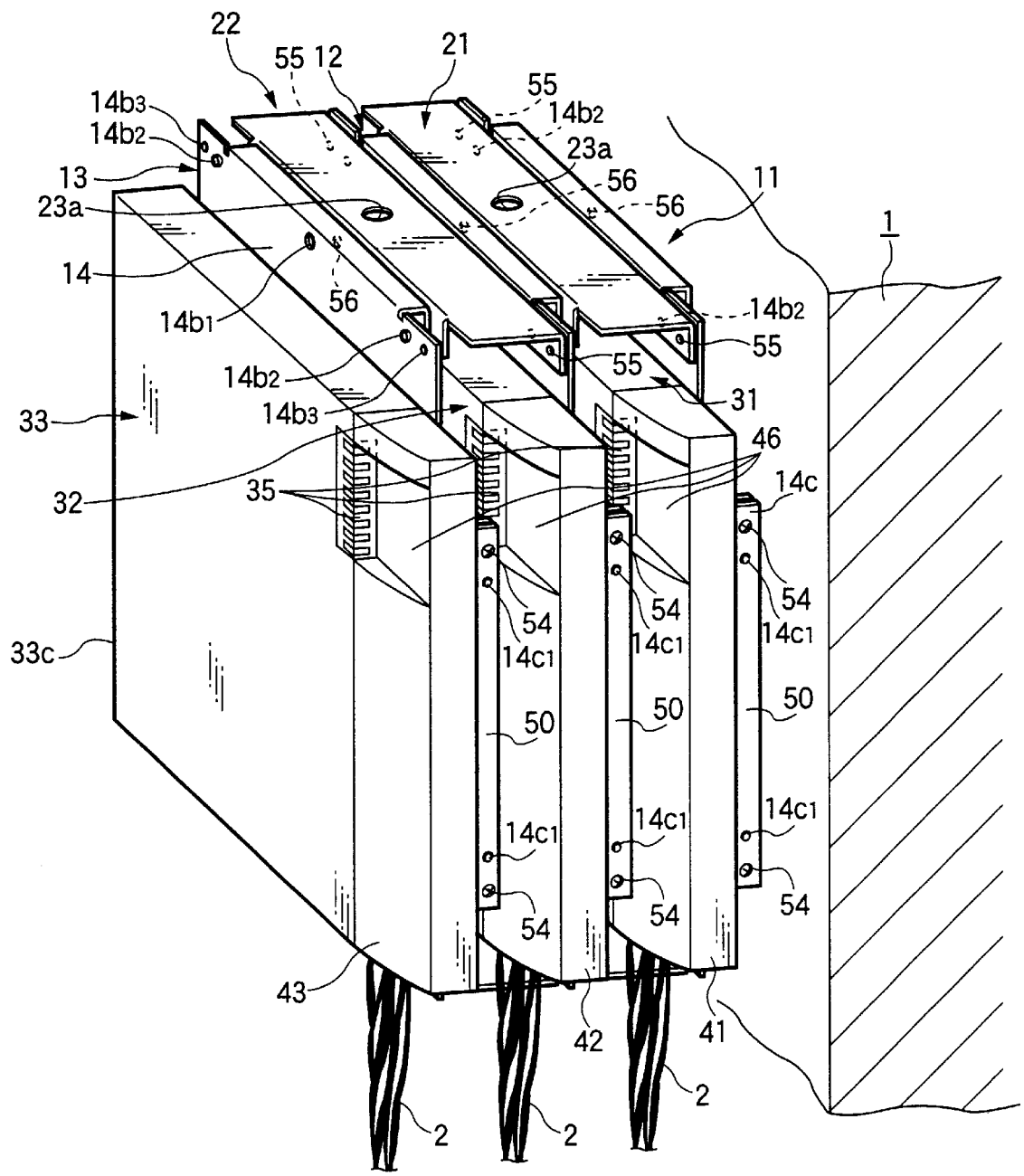
FIG. 1 is a perspective view showing a case where three electronic equipment cases are installed on a wall according to a first embodiment of the invention.

Now, a first embodiment according to the invention will be described referring to the drawings.

Figure 2:
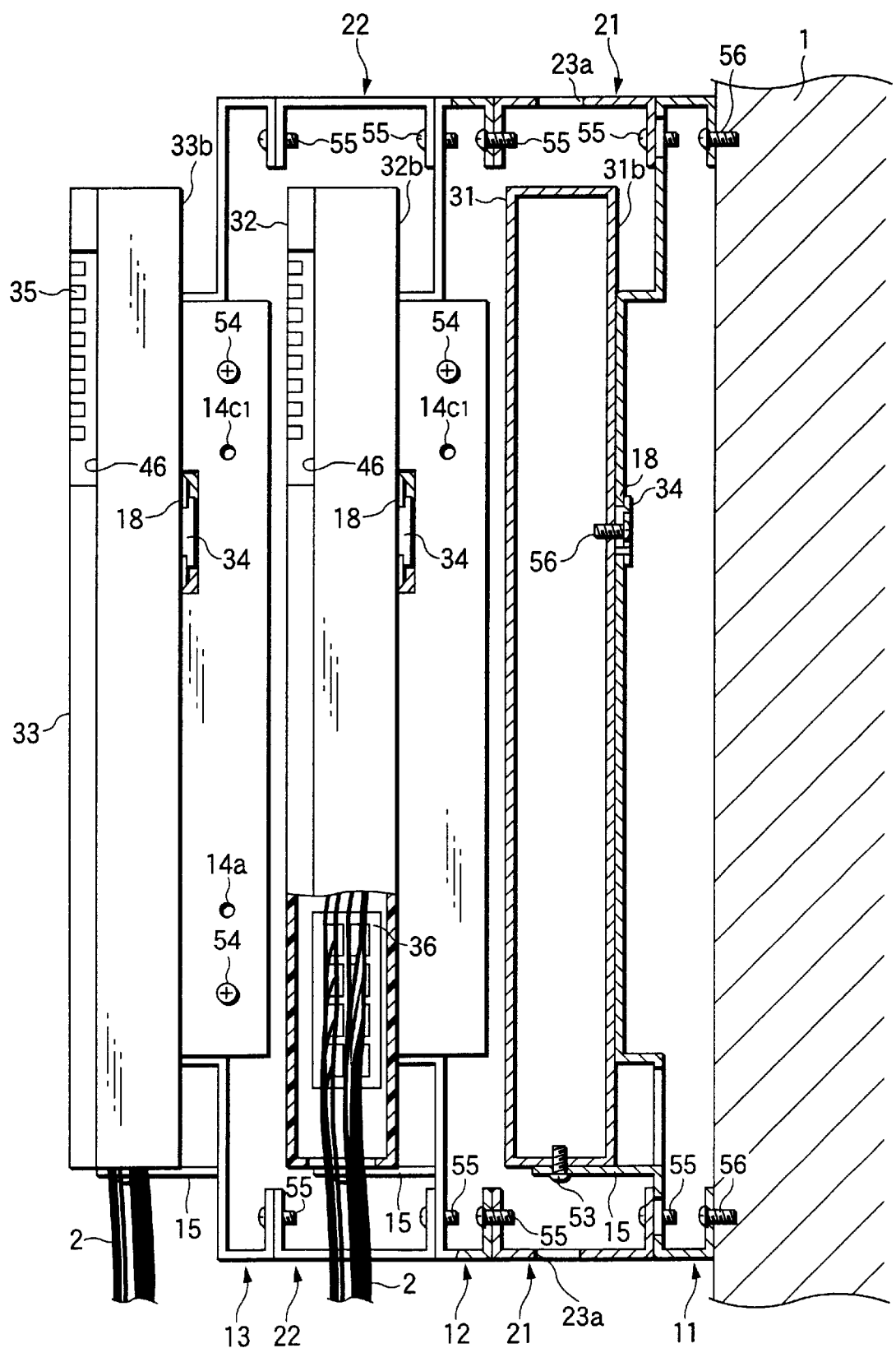
FIG. 2 is a side view of the same.

FIG. 1 is a perspective view showing a case where three electronic equipment cases are installed on a wall of a building or the like, employing the embodiment according to the invention. FIG. 2 is a side view of the same, and FIG. 3 is a bottom view of the same.

Figure 3:
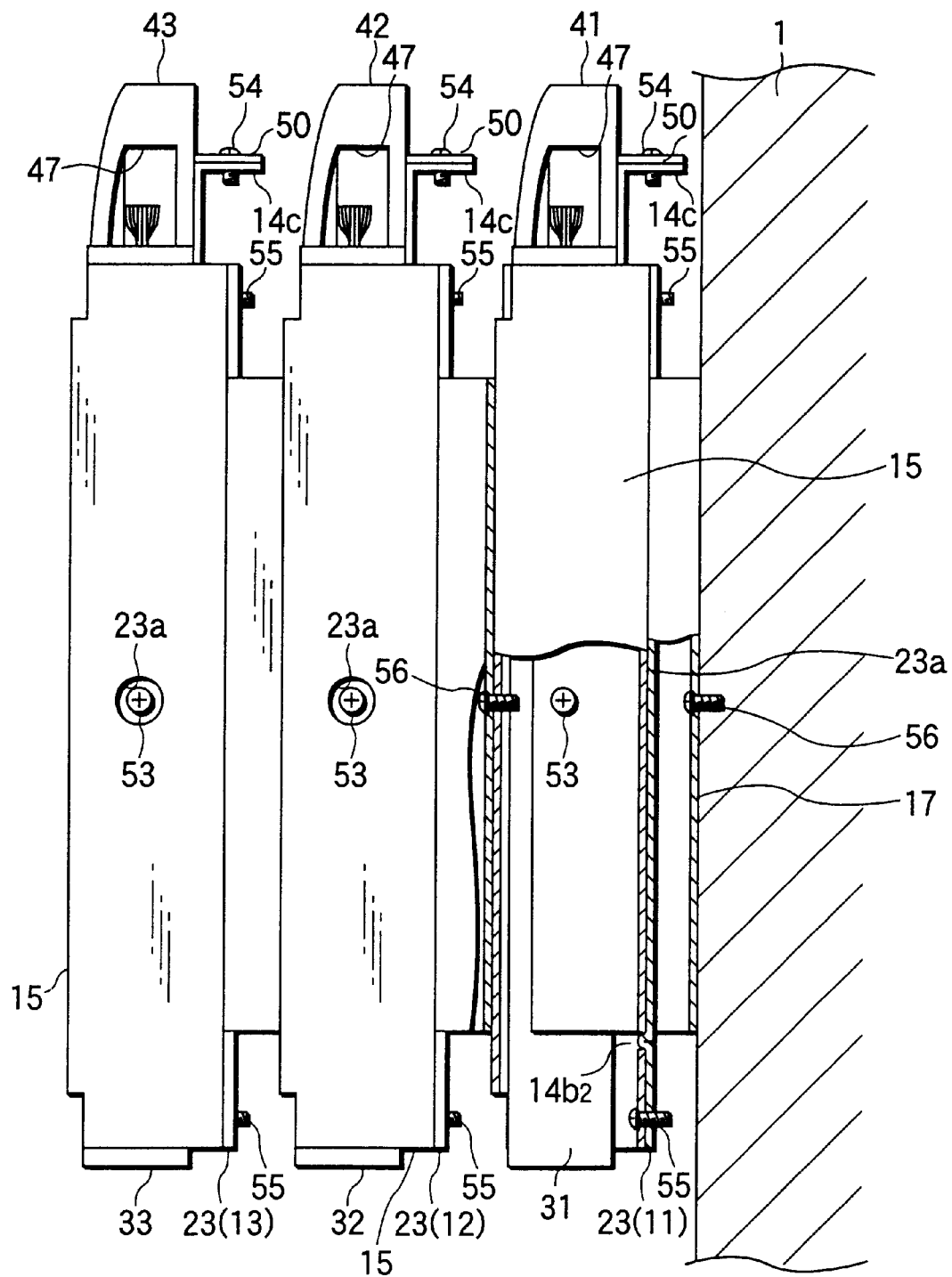
FIG. 3 is a bottom view of the same.

In FIGS. 1 to 3, a first equipment mounting metal plate 11 is attached to a wall 1 of a building or the like, and an electronic equipment case 31 is mounted thereon. A first equipment extension metal piece 21 is fitted to the first equipment mounting metal plate 11.

A second equipment mounting metal plate 12 is attached to the first equipment extension metal piece 21, and a second electronic equipment case 32 is mounted on the second equipment mounting metal plate 12. A further equipment extension metal piece 22 is fitted to the second equipment mounting metal plate 12.

A still further equipment mounting metal plate 13 is fitted to the further equipment extension metal piece 22, and a still further electronic equipment case 33 is mounted on the still further equipment mounting metal plate 13.

In this manner, the electronic equipment cases 31 to 33 can be sequentially installed on the wall 1 in an overlaid manner in a forward direction from the wall, by arranging the equipment mounting metal plates 11, 12, 13 and the equipment extension metal pieces 21, 22 alternately on a front face of the wall 1. Accordingly, it has become possible to effectively install a number of the electronic equipment cases, by effectively utilizing a wall face having a limited area and also utilizing a room space expanding in front of the wall 1.

Bundles of wires 2 of the electronic equipments within the cases respectively arranged on left or right side walls 31a, 32a, 33a of the electronic equipment cases 31, 32, 33. The bundles of wires 2, 2, 2 are covered with wire covers 41, 42, 43 made of synthetic resin or the like which are respectively attached to the equipment mounting metal plates 11, 12, 13.

Figure 4:
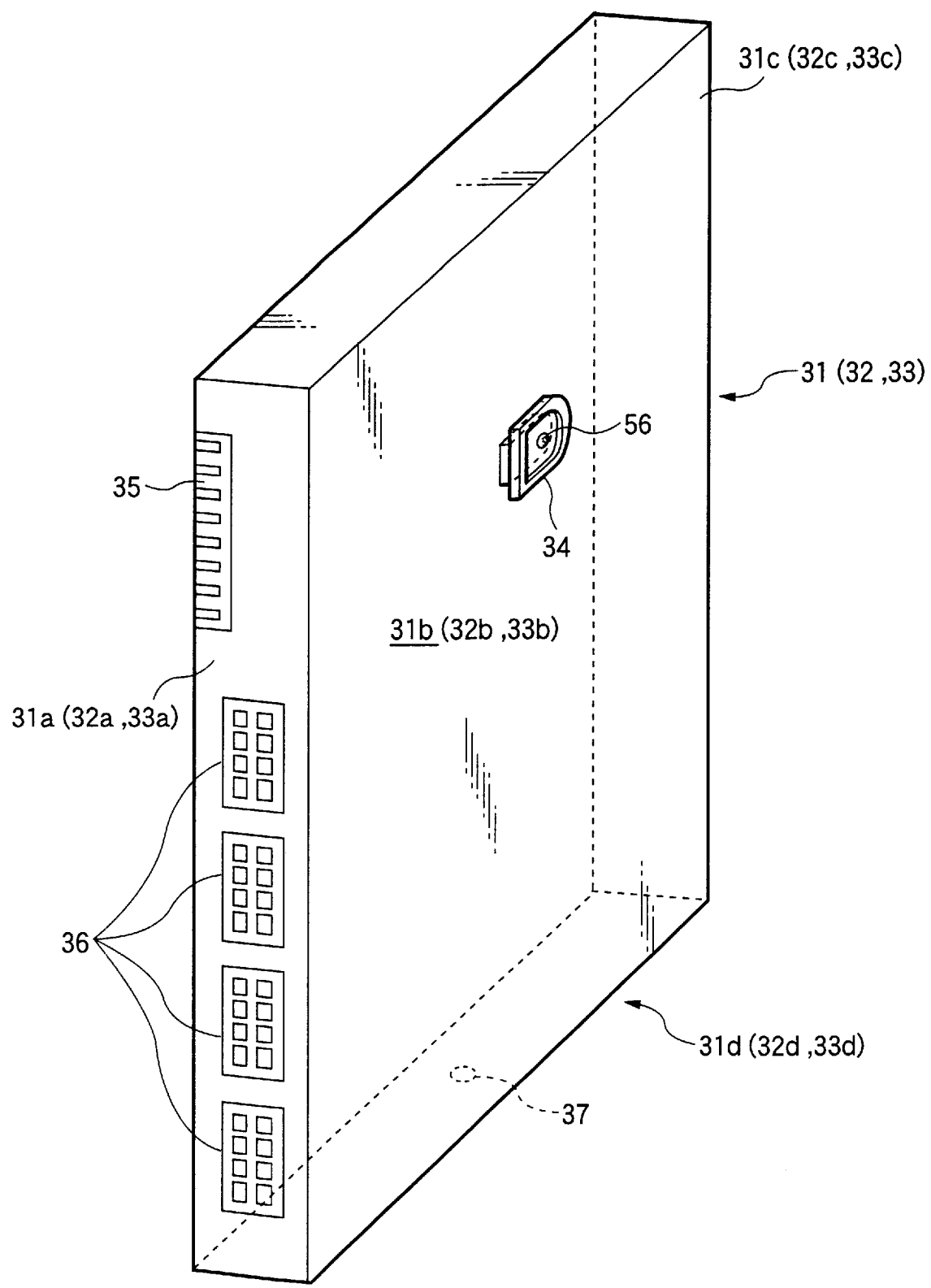
FIG. 4 is a perspective view of one of the electronic equipment cases FIG. 1.

Back walls 31b, 32b, 33b of the electronic equipment cases 31, 32, 33 are respectively provided with engaging projections 34 extending to the left and the right of the electronic equipment cases 31, 32, 33 and fixed by screws 56, as shown in FIG. 4. In this embodiment, the engaging projections 34 are open toward the left side walls 31c, 32c, 33c of the electronic equipment cases 31, 32, 33.

The right side walls 31a, 32a, 33a of the electronic equipment cases 31, 32, 33 are respectively provided at their upper corners with display parts 35 which indicates operating condition of the electronic equipments contained in the electronic equipment cases 31, 32, 33 by lighting an LED or so, and a plurality of connectors 36 for connecting the wire bundles 2.

Bottom walls 31d, 32d, 33d of the electronic equipment cases 31, 32, 33 are respectively provided with threaded holes 37 for fixing the electronic equipment cases 31, 32, 33 to the equipment mounting metal plates 11, 12, 13, at their substantially middle parts.

Figure 5:
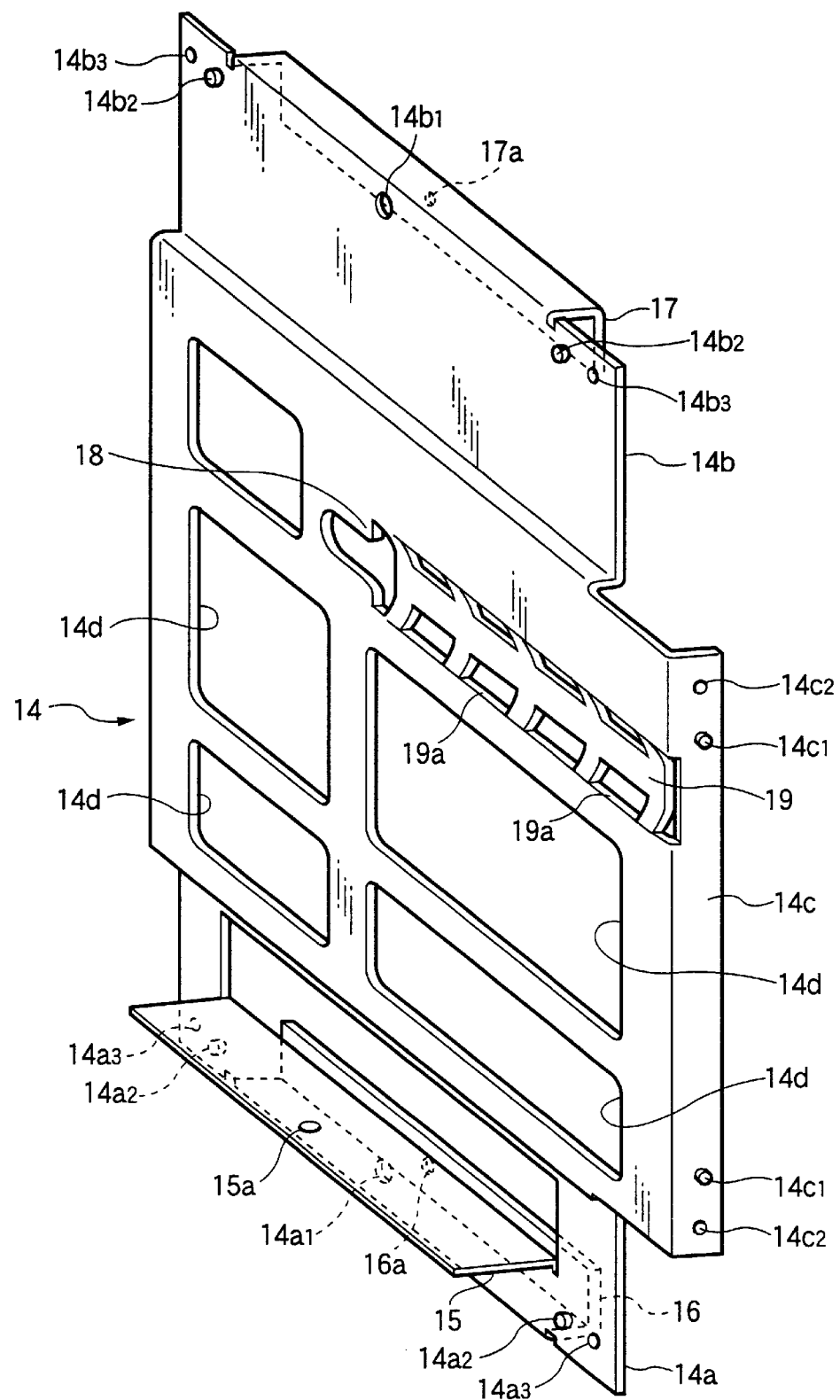
FIG. 5 is a perspective view of a equipment mounting metal plate in FIG. 1.

As shown in FIG. 5, the equipment mounting metal plates 11, 12, 13 respectively include mounting base plates 14 to which the electronic equipment cases 31, 32, 33 are adapted to be fitted. Receiving shelves 15 projecting from lower apron portions 14a at lower ends of the mounting base plates 14 and the bottom walls 31d, 32d, 33d of the electronic equipment cases 31, 32, 33 are placed on the receiving shelves 15. The receiving shelves 15 are formed with through holes 15a through which screws 53 (See FIG. 9) are inserted, in correspondence with the threaded holes 37 of the electronic equipment cases 31, 32, 33. The screw 53 is passed through the through hole 15a and engaged with the threaded hole 37 which is formed in the bottom face of the electronic equipment case 31 to clamp the receiving shelf 15 between a head of the screw 53 and the bottom face of the electronic equipment case 31.

The apron portion 14a at the lower end of the mounting base plate 14 has a lower fitting piece 16 in a substantially L-shape extending in an opposite direction to the receiving shelf 15, and an apron portion 14b at an upper end of the mounting base plate 14 has an upper fitting piece 17 in a substantially L-shape extending in the same direction as the lower fitting piece 16.

Figure 8:
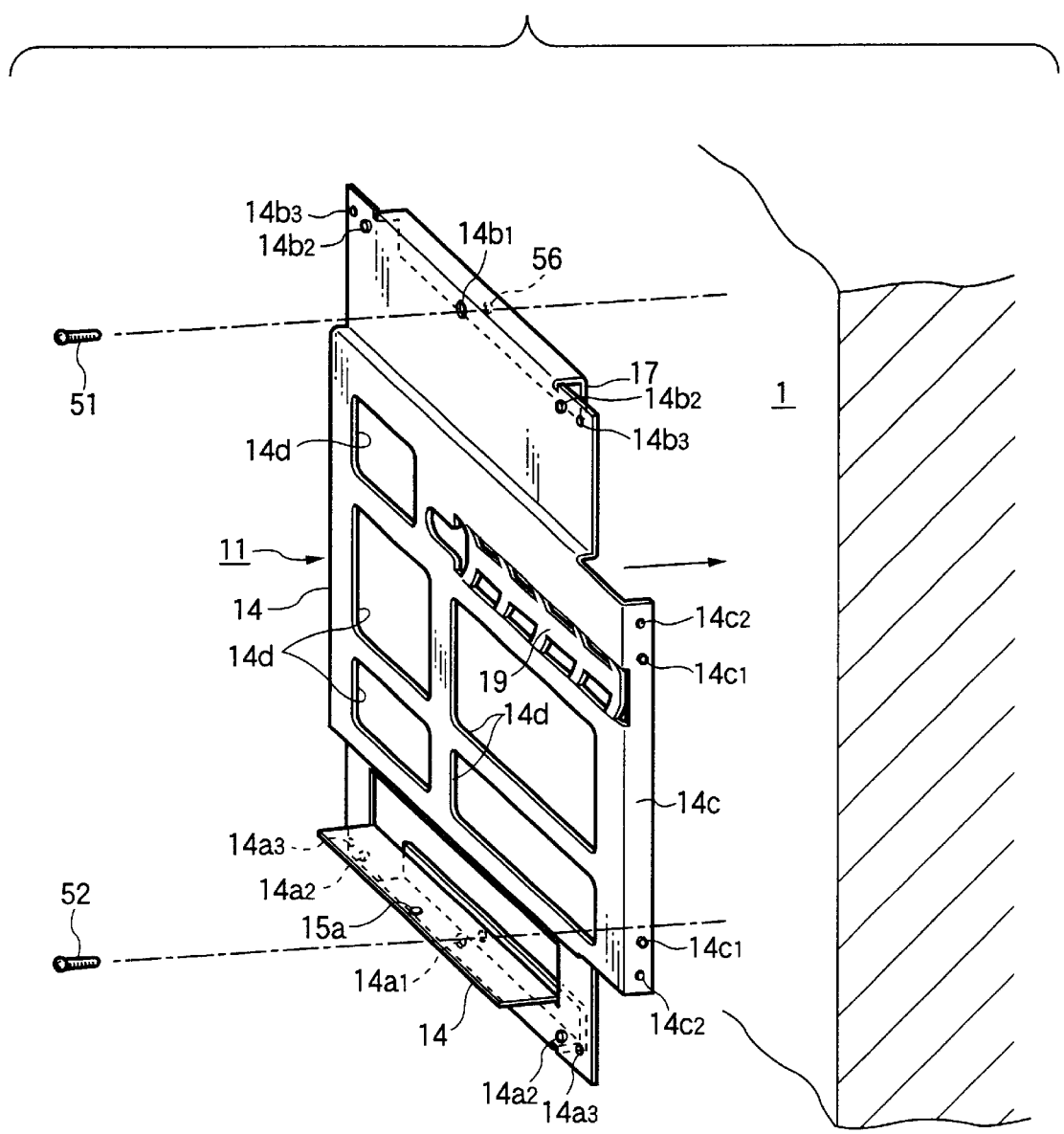
FIG. 8 is a perspective view showing a process of attaching one of the equipment mounting metal plates in FIG. 1 to the wall.

At the substantially middle of both the lower apron portion 14a and the upper apron portion 14b have at their substantially middle parts through holes $14a_1$ and $14b_1$ into which a screwdriver for screwing screws (See FIG. 8) in, in correspondence with the fitting holes 16a and 17a respectively formed in the lower fitting piece 16 and the upper fitting piece 17. On both sides of the through holes $14a_1$ and $14b_1$, there are provided positioning pins $14a_2$ and $14b_2$ for the equipment extension metal pieces 21, 22, 23, and further at both sides of the positioning pins $14a_2$ and $14b_2$, there are provided a pair of fitting holes $14a_3$ and $14b_3$ for fitting the equipment extension metal pieces 21, 22, 23. The fitting holes $14a_3$ and $14b_3$ and the positioning pins $14a_2$ and $14b_2$ constitute means for fitting the equipment extension metal pieces 21, 22, 23.

Each of the mounting base plates 14 is provided with an engaging portion 18 which is adapted to be engaged with the engaging projection 34 of the electronic equipment case 31 (32, 33) to fix the electronic equipment case 31 (32, 33), and a guide groove 19 for guiding the electronic equipment case 31 (32, 33) by means of the engaging projection 34 when the engaging portion 18 is engaged with the engaging projection 34. The guide groove 19 is so constructed as to guide the engaging projection 34 from the right side of the mounting base plate 14 toward the engaging portion 18 located on the left side thereof.

A plurality of thickness reduced portions 14d are formed in the mounting base plate 14, and a plurality of thickness reducing portions 19a are formed in the guide groove 19. The thickness reducing portions 19a are provided in order that the guide groove 19 may not be pulled by the circumference and deformed, when subjected to crimping work.

The mounting base plate 14 is further provided at one side wall (the right side wall in this embodiment) with a cover fitting piece 14c. The cover fitting piece 14c is provided with a pair of positioning pins $14c_1$ for positioning a wire cover 41 (42) and fitting holes $14c_2$ on both sides of the positioning pins.

Figure 6:
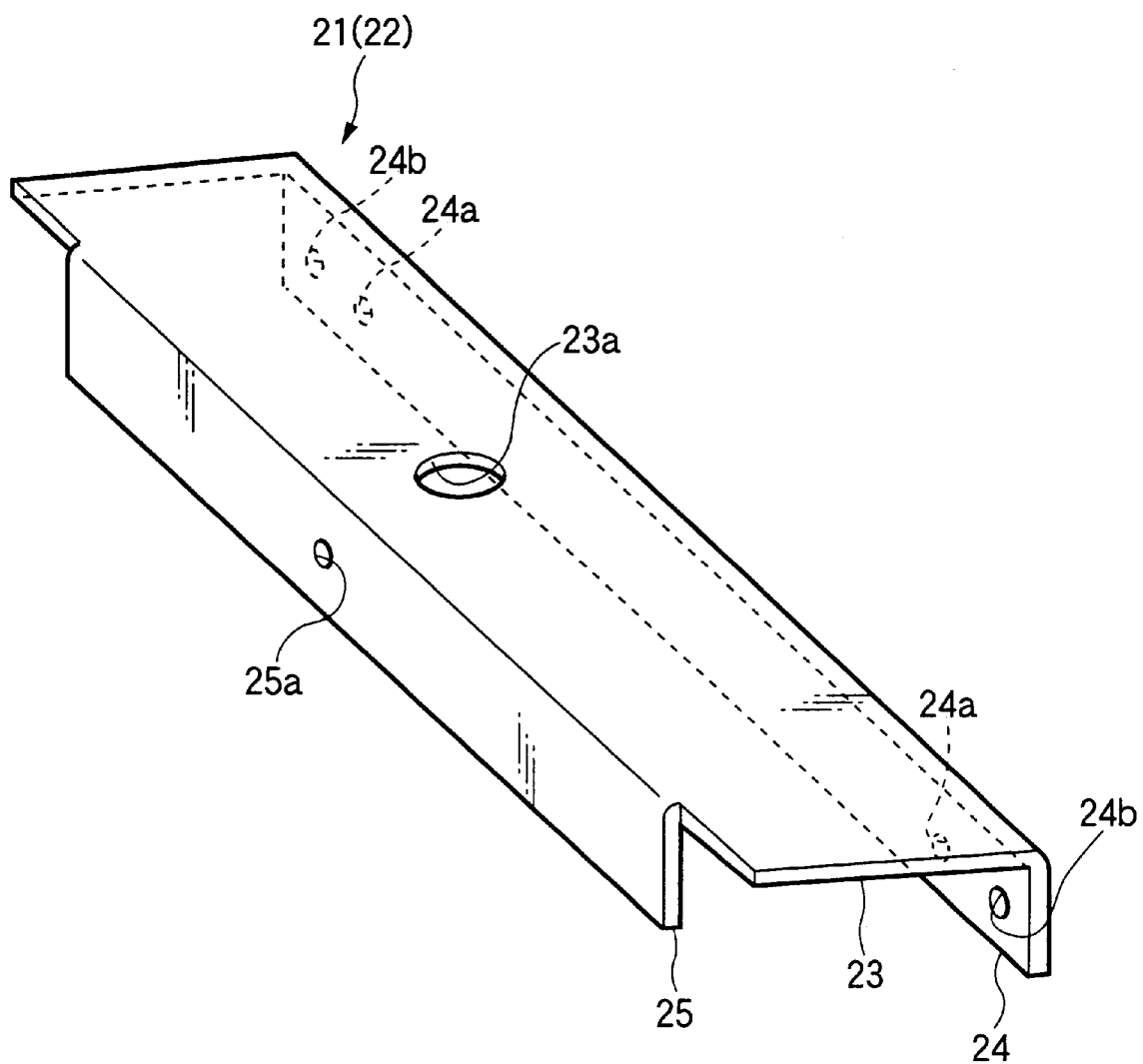
FIG. 6 is a perspective view of a equipment extension metal piece in FIG. 1.

Each of the equipment extension metal pieces 21, 22 includes a base plate 23, and a pair of vertical walls 24, 25 integrally formed in a substantially horseshoe in a longitudinal direction as shown in FIG. 6. There is formed a through hole 23a for inserting a screwdriver at a substantially center part of the base plate 23 in the same manner as the through hole 15a, in correspondence with the threaded hole 37 of the electronic equipment case 31 (32, 33).

At a substantially center part of the vertical wall 24, there are formed positioning holes 24a corresponding to the positioning pins $14a_2$ of the one 11 of the equipment mounting metal plates 11, 12, 13. Further on both sides of the positioning holes 24a, there are formed fitting holes 24b corresponding to the fitting holes $14a_3$.

At a substantially center part of the other 25 of the vertical walls, there is formed a positioning hole 25a which is means for fitting the other equipment mounting metal plate 12 or 13 of the equipment mounting metal plates 11, 12, 13.

Figure 7:
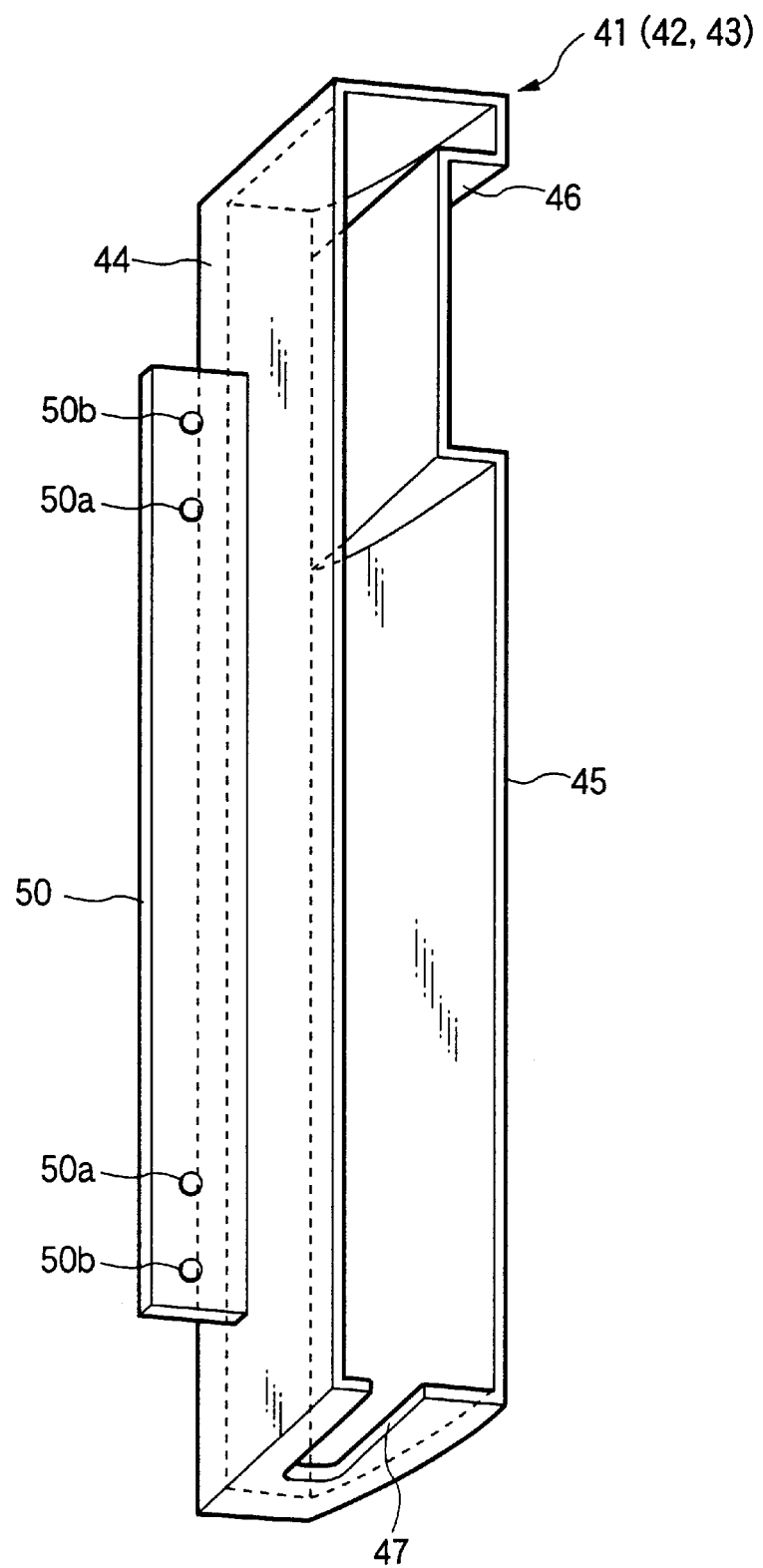
FIG. 7 is a perspective view of a wire cover in FIG. 1.

Each of the wire covers 41, 42, 43 is in a shape of a box as a whole, and open at its one face to receive the wire bundle 2, as shown in FIG. 7. One of its side walls 44 is provided with a protruding fitting piece 50 corresponding to the cover fitting piece 14c. The protruding fitting piece 50 is provided with positioning holes 50a in which the positioning pins $14c_1$ formed in the mounting base plate 14 are adapted to be engaged. On both sides of the positioning holes 50a, there are further formed fitting holes 50b corresponding to the fitting holes $14c_2$.

The other side wall 45 of each of the wire covers 41, 42, 43 has a dented display window 46 in correspondence with the display part 35 of the electronic equipment case 31 (32, 33), so that the display part 35 can be observed even though the wire cover 41 (42, 43) has been fitted to the electronic equipment case 31 (32, 33) to cover the wire bundle 2.

In a bottom wall of the wire cover 41 (42, 43), there is formed a through hole 47 through which the wire bundle 2 is adapted to pass.

Now, referring to FIGS. 8 to 15, a method of mounting the electronic equipment cases 31, 32 to the wall 1 will be described. Detailed explanation of the electronic equipment case 33 will be omitted, because it can be mounted in the same manner as the electronic equipment case 32.

Figure 9:
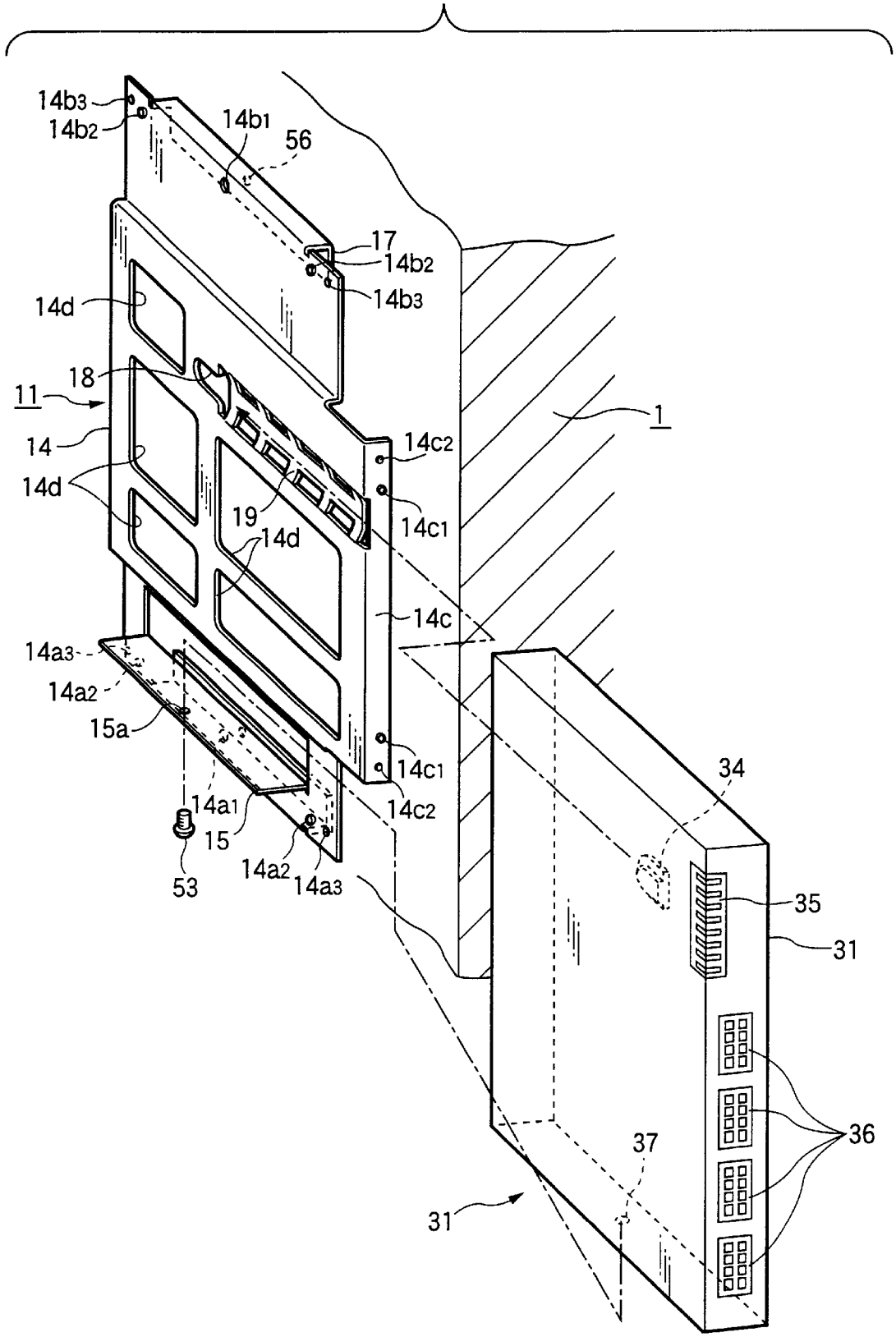
FIG. 9 is a perspective view showing a process of mounting the first electronic equipment case to the first equipment mounting metal plate which has been attached to the wall in FIG. 8.

As a first step, the screwdriver is inserted into the through holes $14a_1$, $14b_1$ which are formed in the lower apron portion 14a and the upper apron portion 14b of the equipment mounting metal plate 11 to fix the lower and the upper parts of the equipment mounting metal plate 11 to the wall 1 by screwing the screws 56 in the fitting holes 17a, 16a and in the threaded bores (not shown) formed in the wall 1 (a state as shown in FIG. 9).

Figure 10:
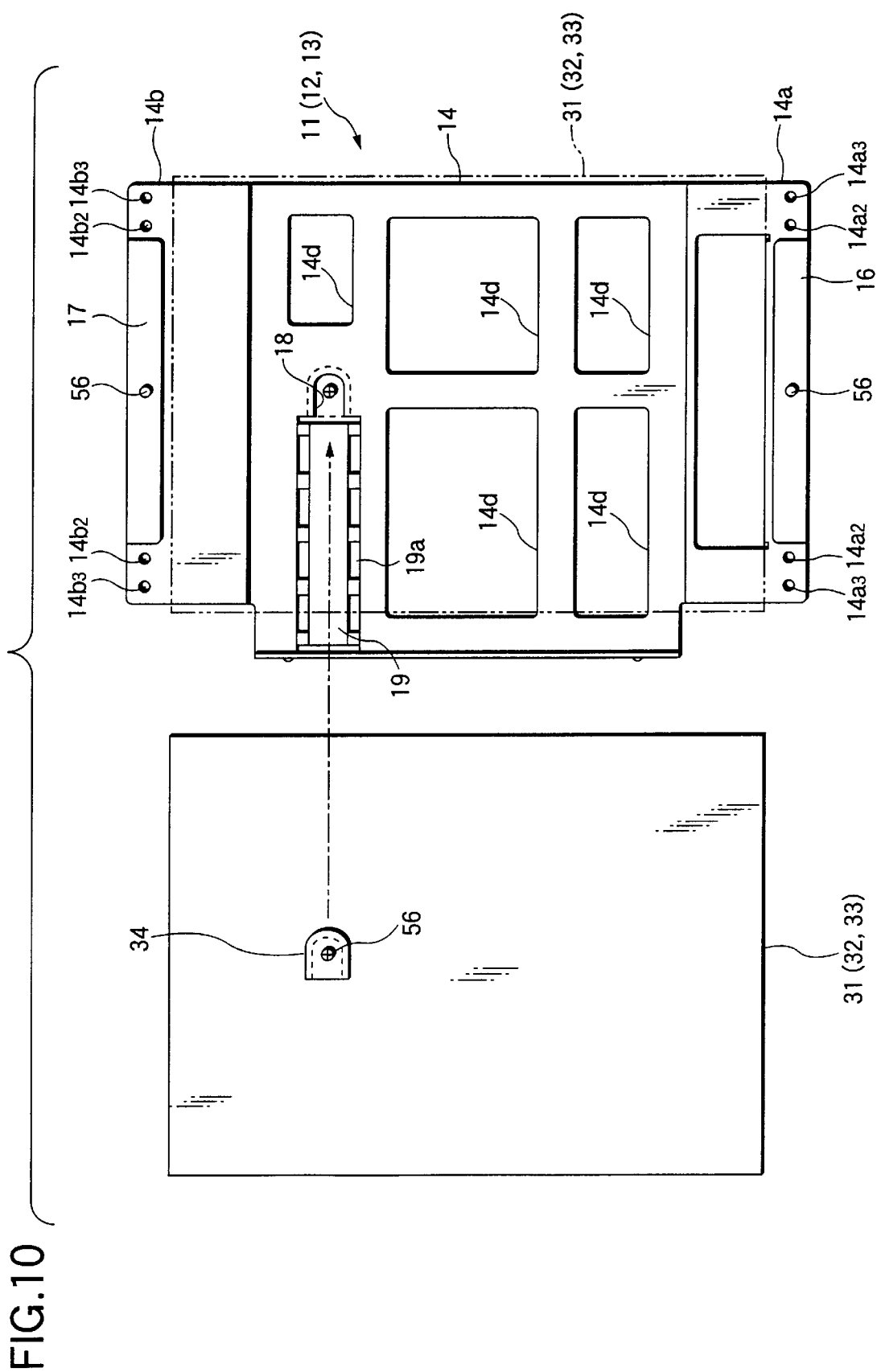
FIG. 10 is a back view of the same.

Then, from the state as shown in FIGS. 9 and 10, the lower face of the electronic equipment case 31 is placed on the receiving shelf 15 of the equipment mounting metal plate 11, and at the same time, the engaging projection 34 is engaged with the engaging portion 18 after inserted into the guide groove 19 to position the electronic equipment case 31 with respect to the equipment mounting metal plate 11.

Figure 11:
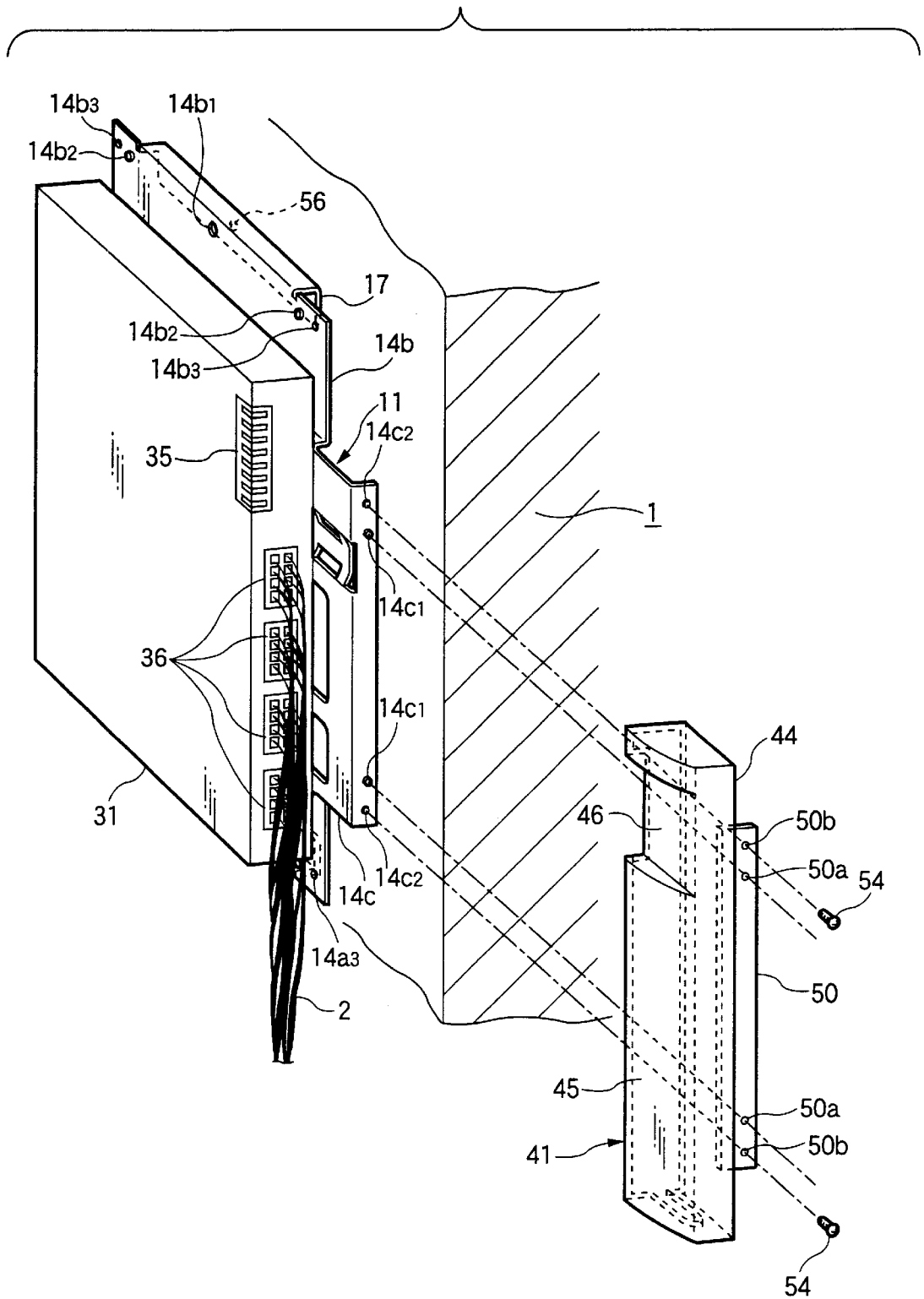
FIG. 11 is a perspective view showing a process of mounting the wire cover to the electronic equipment case which has been mounted to the equipment mounting metal plate in FIG. 9.

Thereafter, the screw 53 is screwed in the threaded hole 37 through the through hole 15a formed in the receiving shelf 15, to fix the electronic equipment case 31 to the equipment mounting metal plate 11 (a state as shown in FIG. 11).

Such screwing work of the screws 53 will be easily conducted, because the electronic equipment case 31 has been already positioned by the engagement of the engaging projection 34 with the engaging portion 18.

Moreover, because the engaging operation of the electronic equipment case 31 with the equipment mounting metal plate 11 is conducted by inserting the electronic equipment case 31 from the side of the equipment mounting metal plate 11, and by engaging the engaging projection 34 with the engaging portion 18, the electronic equipment case 31 only can be detached by unscrewing the screws 53, even after the equipment extension metal piece 21 has been attached to the equipment mounting metal plate 11, or after the equipment mounting metal plate 12 has been attached to the equipment extension metal piece 21, or even after the electronic equipment case 32 has been mounted on the equipment mounting metal plate 12.

Figure 12:
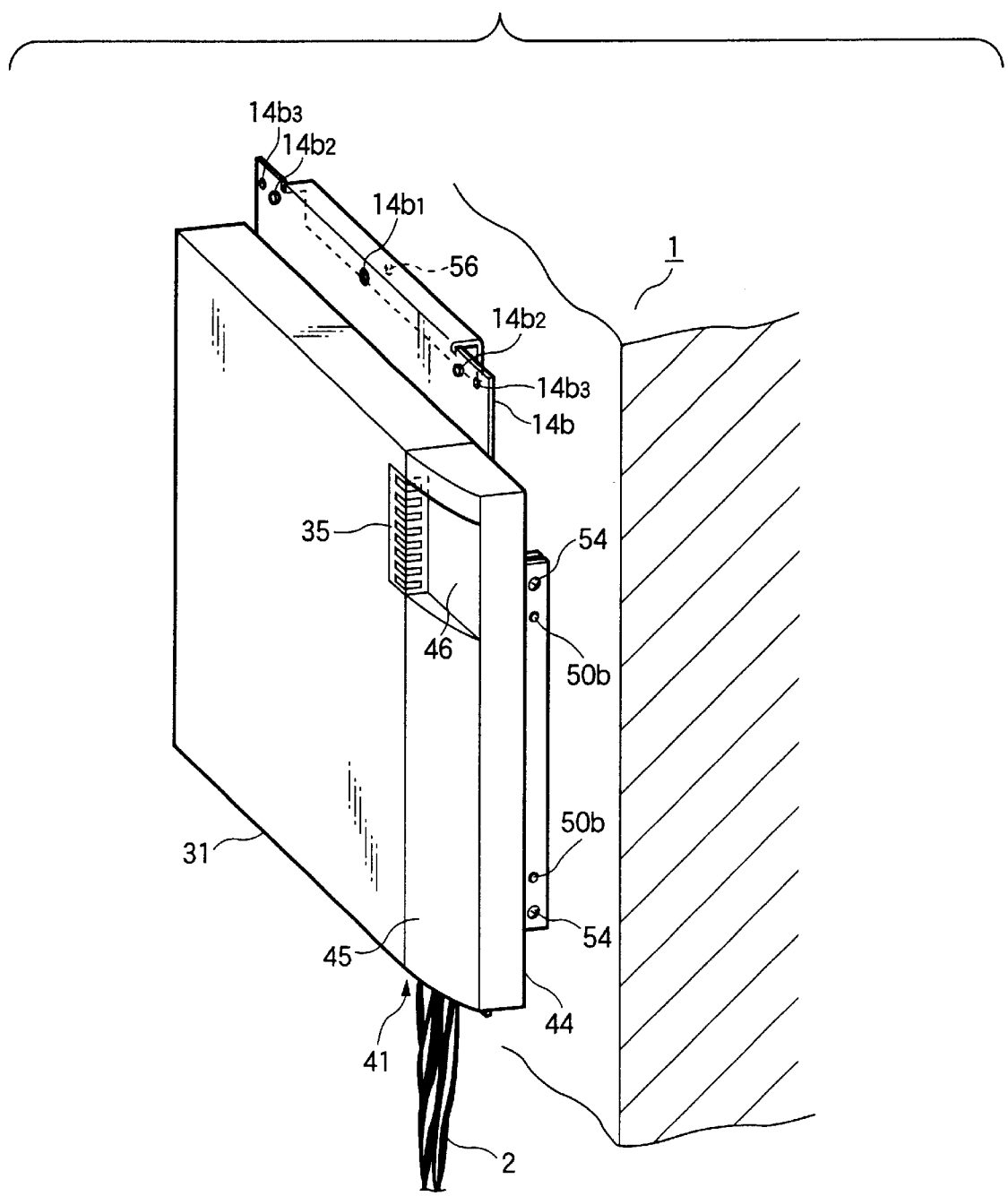
FIG. 12 is a perspective view showing a state wherein the wire cover has been mounted to the first electronic equipment case from the state in FIG. 11.
Figure 13:
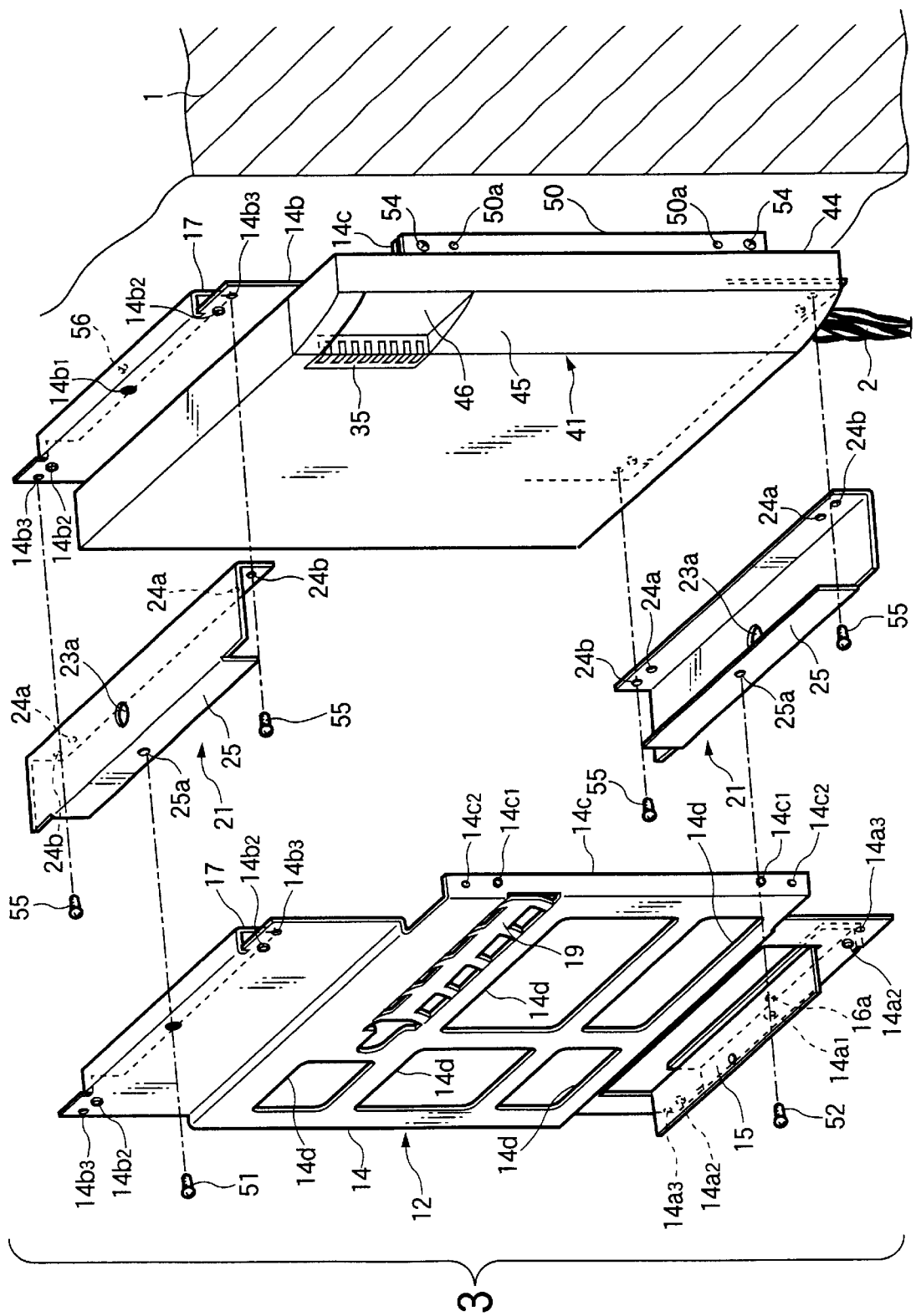
FIG. 13 is a perspective view showing a process wherein the first equipment extension metal piece and the second equipment mounting metal plate are mounted in order to additionally install the second electronic equipment case from the state in FIG. 12.

Then, from the state as shown in FIG. 11, the wire cover 41 is attached in order to cover the wire bundle 2 which is provided on the right side wall 31a of the electronic equipment case 31. This is conducted by first inserting the positioning holes 50a which are formed in the protruding fitting piece 50 of the wire cover 41 over the positioning pins $14c_1$ of the cover fitting piece 14c of the equipment mounting metal plate 11 to position the wire cover 41 with respect to the cover fitting piece 14c, then, by inserting the screws 54 into the fitting holes 50b which are formed in the protruding fitting piece 50, and thereafter, by screwing the screws 54 in the fitting holes $14c_2$ of the cover fitting piece 14c (a state as shown in FIG. 12).

On this occasion, the display part 35 of the electronic equipment case 31 can be observed through the display window 46 of the wire cover 41.

In case where the electronic equipment case 32 is additionally installed besides the electronic equipment case 31, the equipment extension metal piece 21 is attached to the lower fitting piece 16 of the equipment mounting metal plate 11 in such a manner that the vertical walls 24, 25 are directed upward, and thereafter, the positioning pins $14a_2$ provided in the lower apron portion 14a are engaged in the positioning holes 24a to position the equipment extension metal piece 21 with respect to the lower apron portion 14a. Then, the screws 55 are passed through the fitting holes 24b of the equipment extension metal piece 21 and screwed in the fitting holes $14a_3$ in the lower apron portion 14a to fix the equipment extension metal piece 21 to the equipment mounting metal plate 11.

Moreover, the other equipment extension metal piece 21 is attached to the upper fitting piece 17 of the equipment mounting metal plate 11 in such a manner that the vertical walls 24, 25 are directed downward, and thereafter, the positioning pins $14a_2$ provided in the upper apron portion 14b are engaged in the positioning holes 24a to position the equipment extension metal piece 21 with respect to the upper apron portion 14b. Then, the screws 55 are passed through the fitting holes 24b of the other equipment extension metal piece 21 and screwed in the fitting holes $14b_3$ in the upper apron portion 14b to fix the other equipment extension metal piece 21 to the equipment mounting metal plate 11.

As the result of having fixed the equipment extension metal pieces 21 to the equipment mounting metal plate 11 in this manner, the equipment mounting metal plate 12 can be fitted to the equipment extension metal pieces 21. After the screw 51 is inserted into the fitting hole $14b_1$ formed in the upper apron portion 14b of the equipment mounting metal plate 12, the screw 51 is screwed in the fitting hole 17a and the threaded bore 25a formed in the equipment extension metal piece 21 to fix the upper part of the equipment mounting metal plate 12 to the equipment extension metal pieces 21. Meanwhile, after the screw 52 is inserted into the fitting hole $14a_1$ formed in the lower apron portion 14a, the screw 52 is screwed in the fitting hole 16a and the threaded bore 25a formed in the equipment extension metal piece 21 to fix the lower part of the equipment mounting metal plate 12 to the equipment extension metal pieces 21 (a state as shown in FIG. 14).

Figure 14:
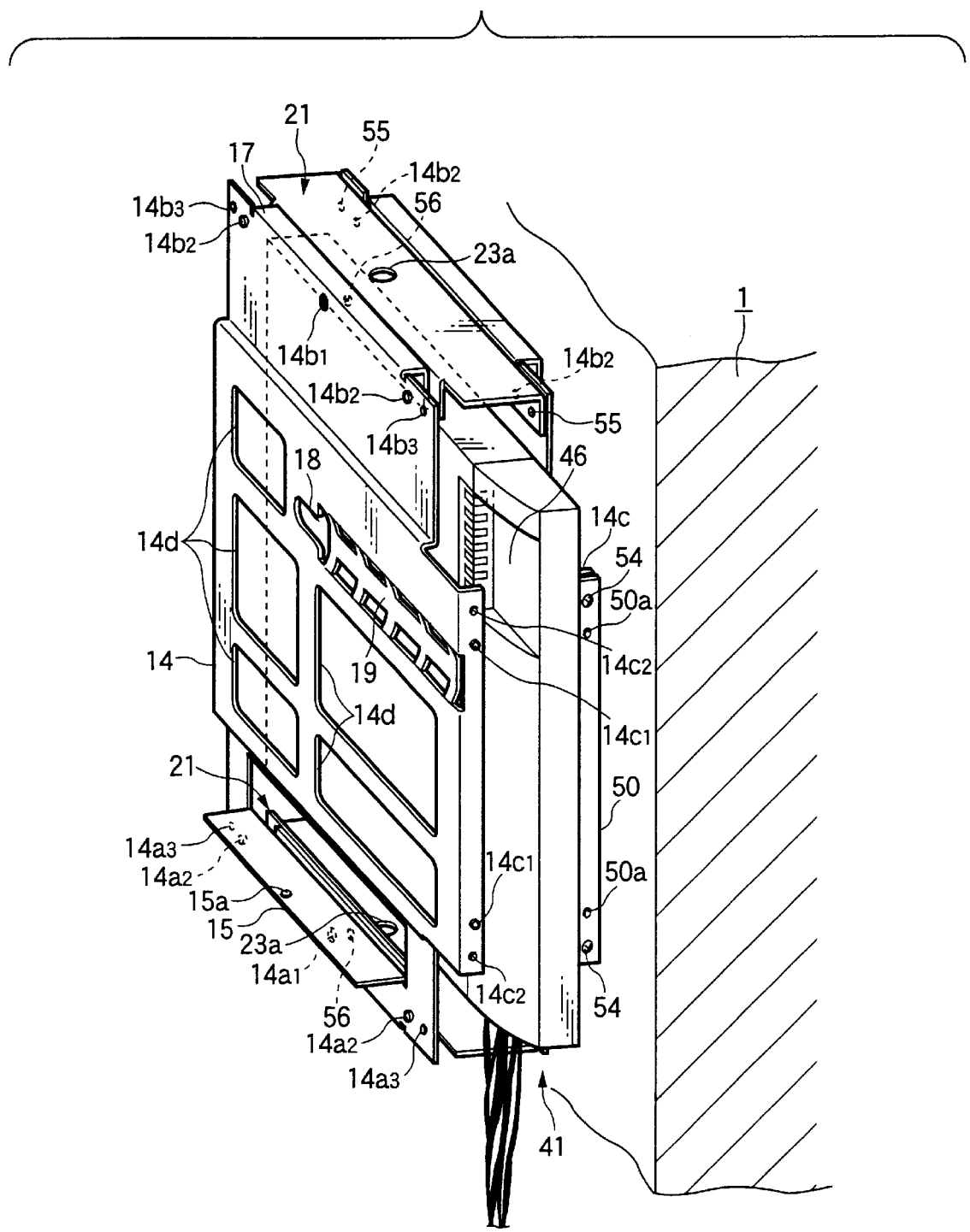
FIG. 14 is a perspective view showing a state wherein the first equipment extension metal piece and the second equipment mounting metal plate have been mounted from the state in FIG. 13.

Then, from the state as shown in FIG. 14, the lower face of the electronic equipment case 32 is placed on the receiving shelf 15 of the equipment mounting metal plate 12, and at the same time, the engaging projection 34 is engaged with the engaging portion 18 after passed through the guide groove 19 to position the electronic equipment case 32 with respect to the equipment mounting metal plate 12. Thereafter, the screw 53 is screwed in the threaded hole 37 through the through hole 15a formed in the receiving shelf 15, to fix the electronic equipment case 32 to the equipment mounting metal plate 12 (a state as shown in FIG. 15).

Figure 15:
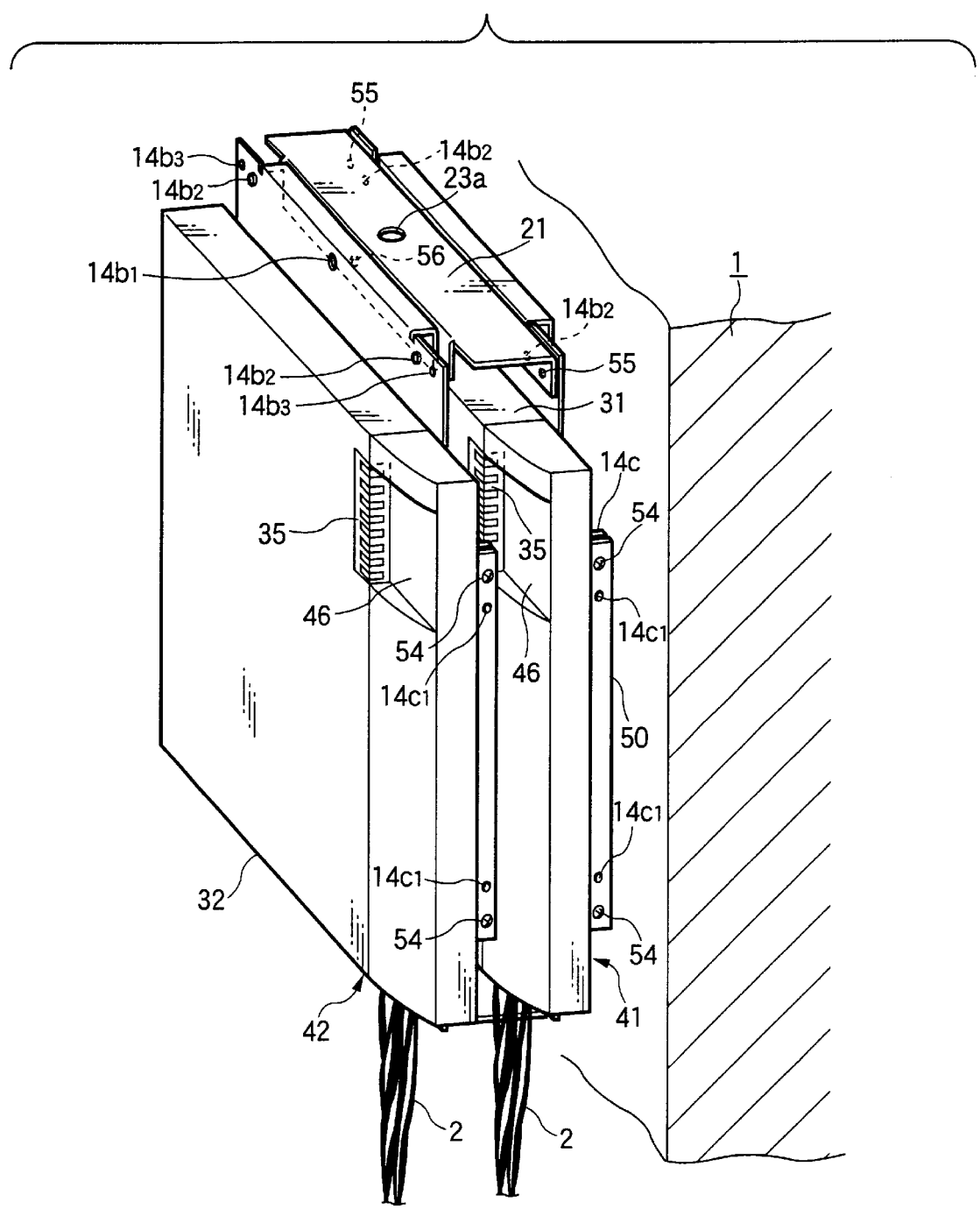
FIG. 15 is a perspective view showing a state wherein the second electronic equipment case has been additionally installed from the state in FIG. 14.

Then, from the state as shown in FIG. 15, in order to cover the wire bundle 2 which is provided on the right side wall 31a of the electronic equipment case 32, the positioning holes 50a which are formed in the protruding fitting piece 50 of the wire cover 42 are inserted over the positioning pins $14c_1$ of the cover fitting piece 14c of the equipment mounting metal plate 12 to position the wire cover 42 with respect to the cover fitting piece 14c, and then, the screws 54 are inserted into the fitting holes 50b which are formed in the protruding fitting piece 50. Thereafter, the screws 54 are screwed in the fitting holes $14c_2$ of the cover fitting piece 14c (a state as shown in FIG. 15).

On this occasion, the display part 35 of the electronic equipment case 32 can be observed through the display window 46 of the wire cover 42.

In order to additionally install the electronic equipment case 33, the equipment extension metal piece 22 is attached to the equipment mounting metal plate 12, and the equipment mounting metal plate 13 is attached to the equipment extension metal piece 22 as shown in FIG. 1.

The attachment of the equipment extension metal piece 22 to the equipment mounting metal plate 12, and the attachment of the equipment mounting metal plate 13 to the equipment extension metal piece 22 are conducted in the same manner as the above described attachment of the equipment extension metal piece 21 to the equipment mounting metal plate 11 as well as the attachment of the equipment mounting metal plate 12 to the equipment extension metal piece 21, and the electronic equipment case 33 is mounted to the equipment mounting metal plate 13 which has been attached to the equipment extension metal piece 22.

Figure 16:
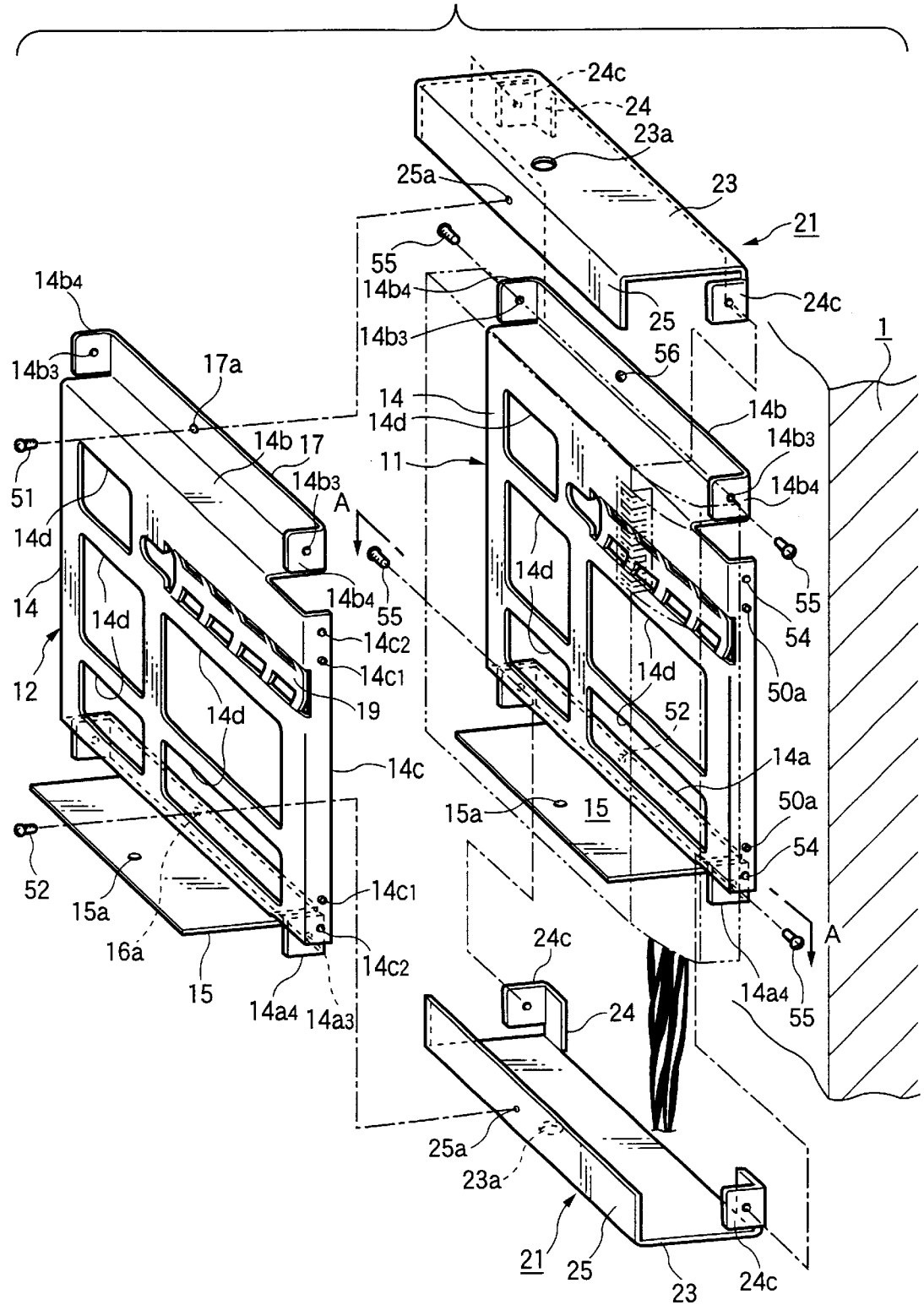
FIG. 16 is an exploded view showing a second embodiment according to the invention.
Figure 17:
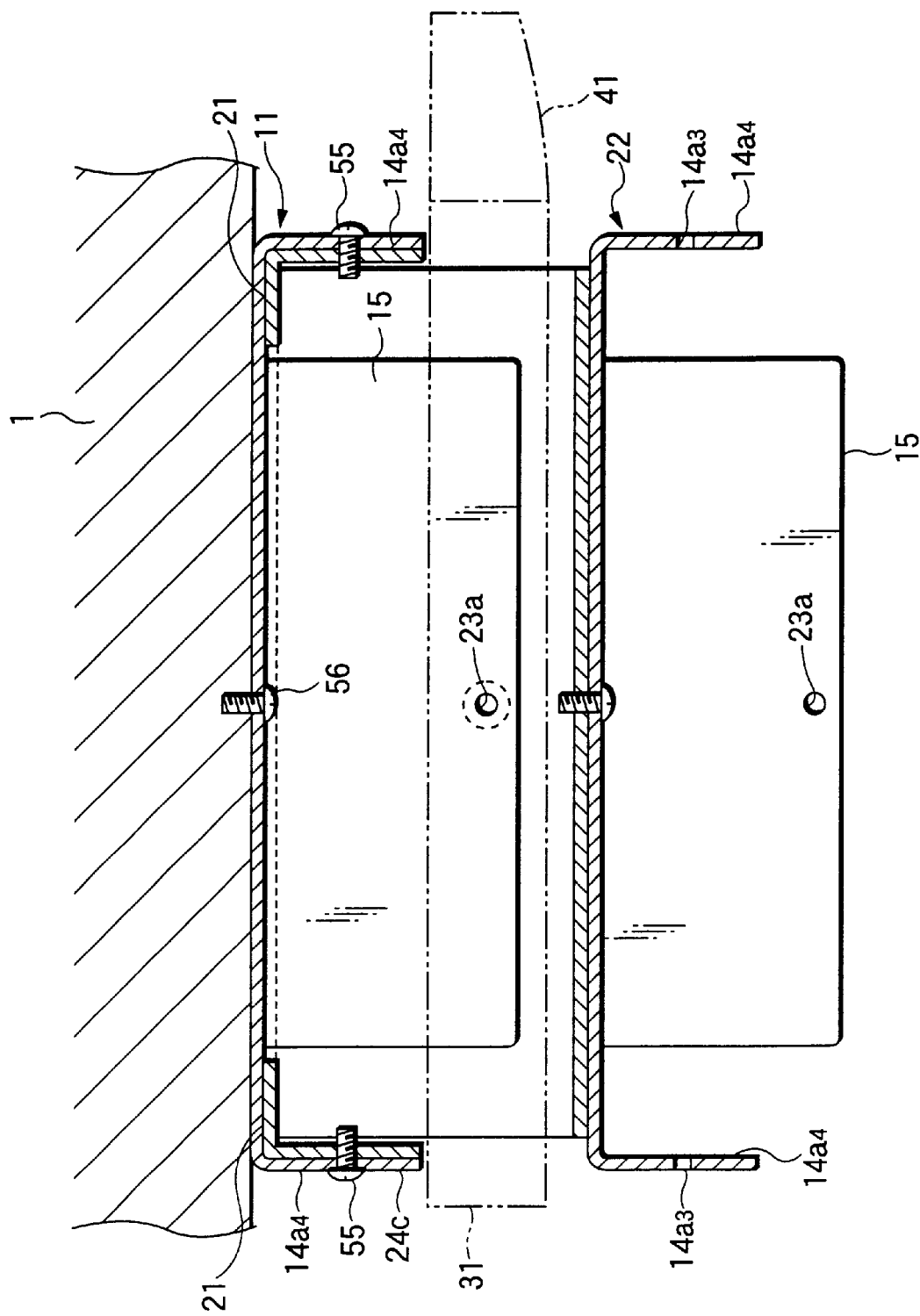
FIG. 17 is a sectional view taken along a line A—A of FIG. 16.

FIGS. 16 and 17 show a second embodiment according to the invention. In the above described first embodiment, the equipment mounting metal plate 11 and the equipment extension metal piece 21 arranged on both the upper and lower parts of the equipment mounting metal plate 11 are fixed to each other by engaging the lower apron portion 14a and the upper apron portion 14b of the equipment metal mounting plate 11 with the vertical walls 24, 25 of the equipment extension metal pieces 21. On the other hand, in the second embodiment, the lower apron portion 14a and the upper apron portion 14b of the equipment metal mounting plate 11 are provided with fitting portions $14a_4$, $14b_4$ respectively on their opposite sides, while the vertical wall 24 of the equipment extension metal piece 21 is cut away at its middle part, and opposite ends of the vertical wall 24 are projected toward opposite ends of the base plate 23 to form fitting portions 24c correspondingly so that the equipment mounting metal plate 11 and the equipment extension metal pieces 21, 22 can be fitted to each other at their respective opposite sides.

By constructing the equipment mounting metal plates and the equipment extension metal pieces in this manner, the equipment mounting metal plates 11, 12 and the equipment extension metal pieces 21, 22 will not protrude from the electronic equipment cases 31, 32, 33 as seen from the front.

In order to fix the equipment mounting metal plate 12 to the equipment extension metal piece 21, the screw 52 is screwed in the fitting hole 25a in the vertical wall 25 of the equipment extension metal piece 21 and the fitting holes 16a, 17a of the upper and lower fitting pieces 16, 17 of the equipment mounting metal plate 12, in the same manner as in the first embodiment. The equipment mounting metal plate 12 is the same as the equipment mounting metal plate 11 in that the fitting portions $14a_4$, $14b_4$ are respectively formed at the opposite sides of the lower apron portion 14a and the upper apron portion 14b.

Figure 18:
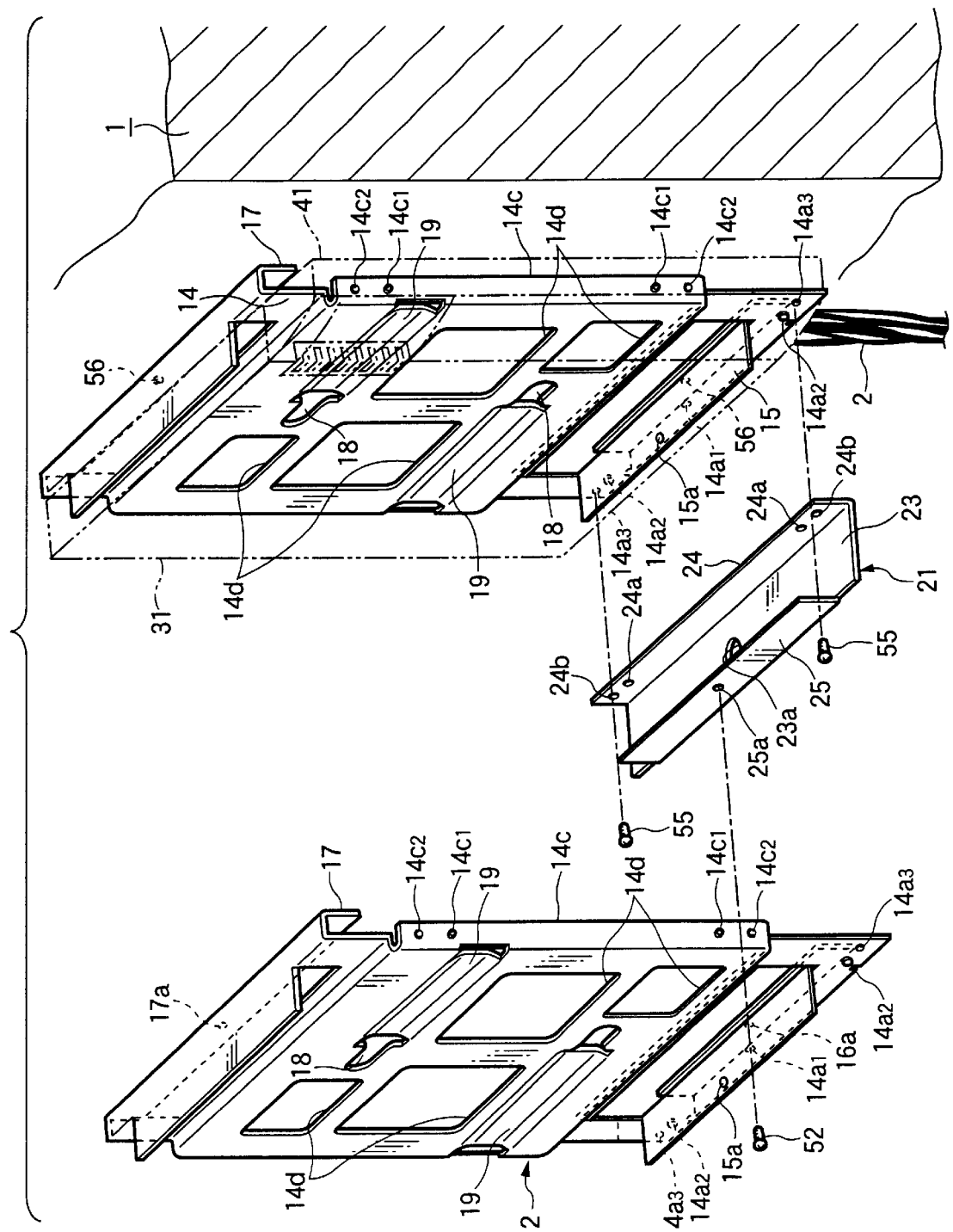
FIG. 18 is an exploded view showing a third embodiment according to the invention in a case where the equipment extension metal piece is provided at a lower part of the equipment mounting metal plate.
Figure 19:
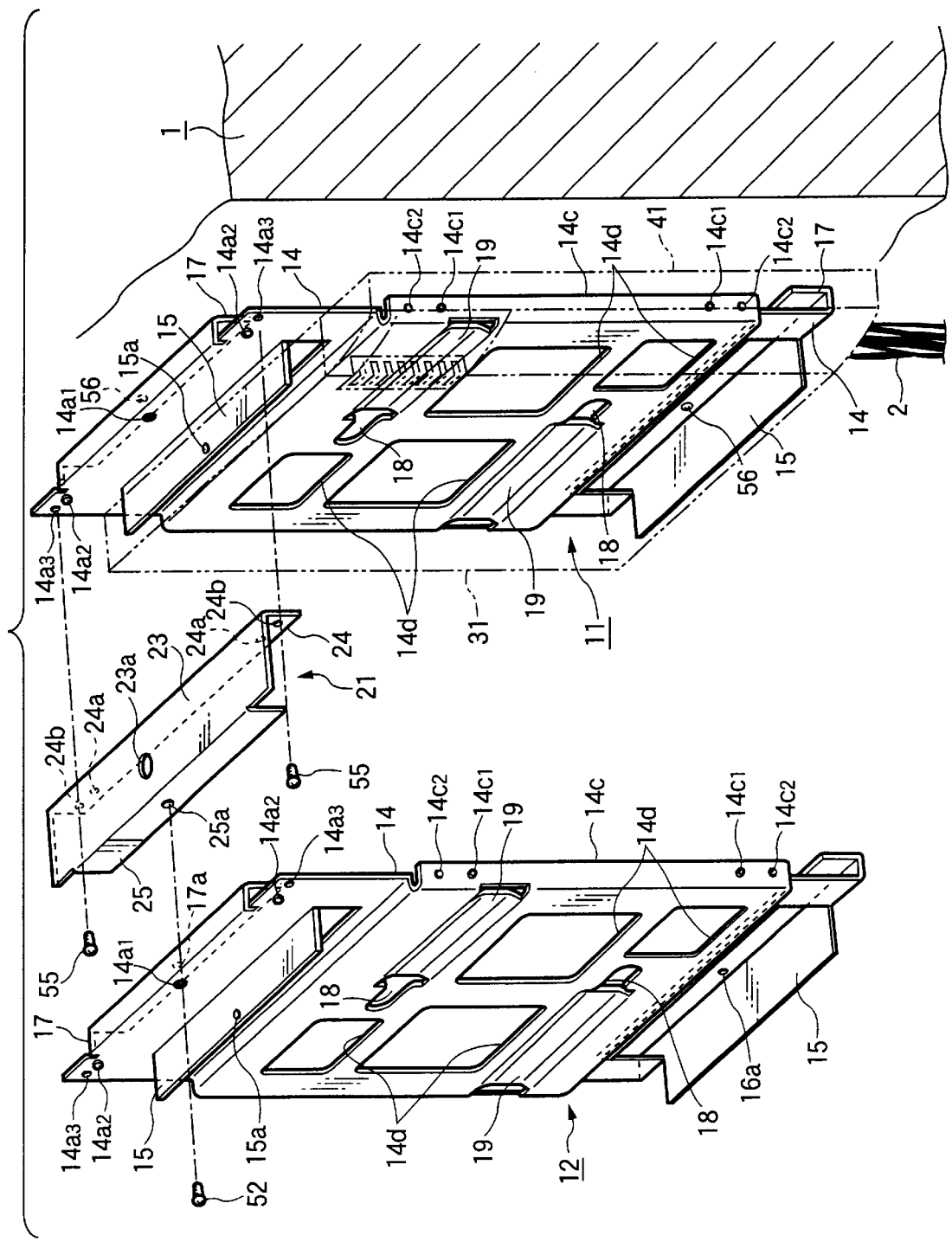
FIG. 19 is an exploded view showing a case where the equipment extension metal piece is provided at an upper part of the equipment mounting metal plate.

FIGS. 18 to 21 show a third embodiment of the invention. In the above described first embodiment, the equipment extension metal pieces 21, 22 are respectively fitted to both the upper and lower ends of the equipment mounting metal plates 11, 12 (or 13), while in the third embodiment, the equipment extension metal pieces 21, 22 are fitted to only the lower apron portion 14a of the equipment mounting metal plates 11, 12 (or 13) (in a case as shown in FIG. 18), or only to the upper apron portion 14b (in a case as shown in FIG. 19).

By constructing the equipment mounting metal plates and the equipment extension metal pieces in this manner, protrusion of the equipment mounting metal plates 11, 12 (or 13) and the equipment extension metal pieces 21, 22 from the outer shapes of the electronic equipment cases 31, 32, 33 can be reduced to the minimum extent.

Figure 20:
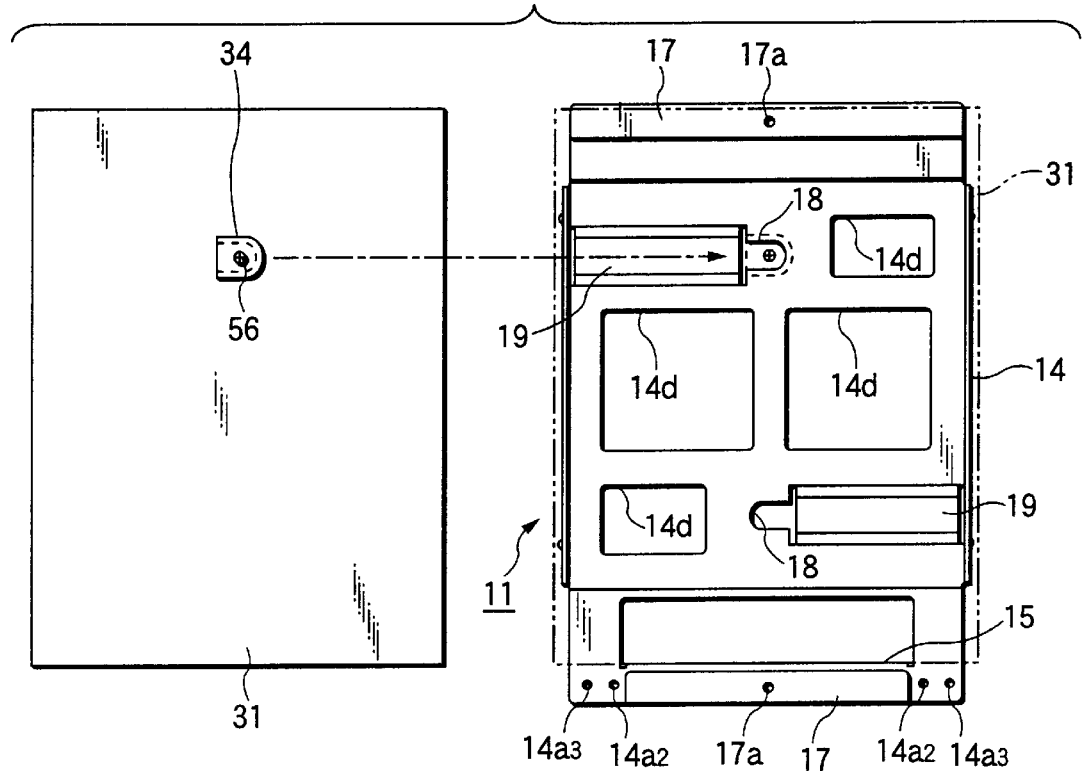
FIG. 20 is an explanatory view showing relation of the equipment mounting metal plate and the equipment extension metal piece with respect to the electronic equipment case FIG. 18.
Figure 21:
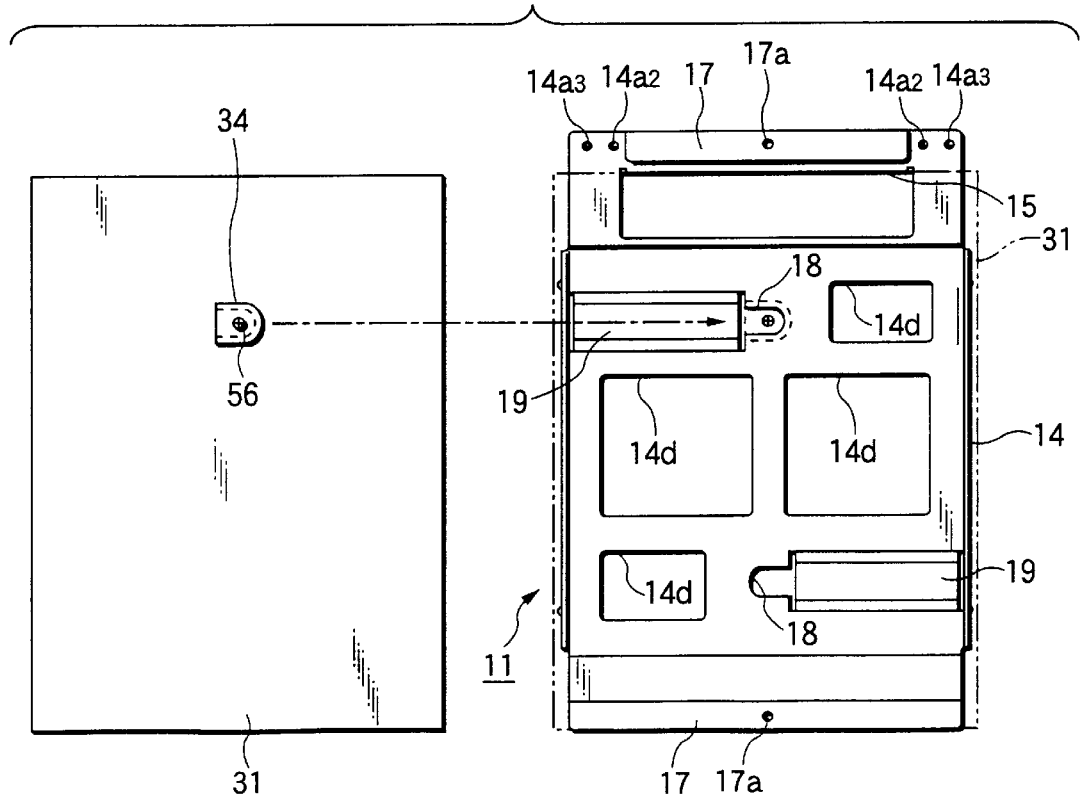
FIG. 21 is an explanatory view showing relation of the equipment mounting metal plate and the equipment extension metal piece with respect to the electronic equipment case in FIG. 19.

In connection with such a structure, there are formed pairs of the engaging portions 18 and the guide grooves 19 in both the upper and lower parts of the mounting base plates 14 of the equipment mounting metal plates 11, 12 (or 13). Therefore, in both cases where the equipment extension metal pieces 21, 22 are provided at the lower parts of the equipment mounting metal plates 11, 12 (or 13) as shown in FIG. 20, and where the equipment extension metal pieces 21, 22 are provided at the upper parts of the equipment mounting metal plates 11, 12 (or 13) as shown in FIG. 21, the electronic equipment cases 31, 32, 33 can be installed from the same direction enabling the engaging projections 34 to be engaged with the engaging portions 18, by rotating the equipment mounting metal plates 11, 12 (or 13) by 180 degree.

According to the present invention, a plurality of the electronic equipment cases can be sequentially overlaid on the front face of the wall, by additionally providing the equipment mounting metal plates and the equipment extension metal pieces one by one in front of the wall. As the results, the wall having a limited space can be effectively utilized, and a number of the electronic equipment cases can be effectively installed using the room space expanding in front of the wall.

What is claimed is:

1. A wall mounting device for installing a plurality of electronic equipment cases on a wall comprising an equipment mounting metal plate to be attached to the wall, and an equipment extension metal piece which installs a second electronic equipment case in front of the wall overlaid on a first electronic equipment case, said equipment mounting metal plate including:

a receiving shelf on which a lower face of the first electronic equipment case is placed;

a mounting base plate from which the receiving shelf is projected;

a fixing part for fixing the first electronic equipment case to the mounting base plate; and a metal plate fitting unit for fitting the equipment extension metal piece.

2. A wall mounting device as claimed in claim 1, wherein the equipment extension metal piece includes an extension fitting unit for fitting a second equipment mounting metal plate to support the second electronic equipment case in front of the wall overlaid on the first electronic equipment case.

3. A wall mounting device as claimed in claim 2, wherein the equipment mounting metal plates and the equipment extension metal piece are alternately arranged on a front face of the wall, whereby the plurality of electronic equipment cases are sequentially overlaid to be installed on the front face of the wall.

4. A wall mounting device as claimed in claim 1, wherein the equipment extension metal piece is fitted to one of an upper part and a lower part of the equipment mounting metal plate.

5. A wall mounting device as claimed in claim 1, wherein a plurality of the equipment extension metal pieces are fitted to both an upper part and a lower part of the equipment mounting metal plate.

6. A wall mounting device as claimed in claim 1, wherein the fixing part includes:

an engaging portion formed in the mounting base plate and engaged with an engaging projection provided on a back face of the first electronic equipment case; and a threaded part for screw fitting the first electronic equipment case.

7. A wall mounting device as claimed in claim 6, wherein the engaging projection and the engaging portion are constructed so that the first electronic equipment case can be engaged with the equipment mounting metal plate by laterally moving the case with respect to the metal plate.

8. A wall mounting device as claimed in claim 1, further comprising:

a wire bundle of an electronic equipment provided on a left or right side wall of the first electronic equipment case; and a wire cover attached to the equipment mounting metal plate for covering the wire bundle.

9. A wall mounting device as claimed in claim 8, wherein the wire cover includes with a dented display window for exposing a display part provided on corner of the side wall of the first electronic equipment case.

10. A wall mounting device as claimed in claim 1, wherein the metal plate fitting unit is constructed in such a manner that both the metal plate and the metal piece are fitted to each other at their side parts.

* * * * *